(12) United States Patent
Mizuno (10) Patent No.: US 6,414,852 B1
(45) Date of Patent: Jul. 2, 2002

(54) INTEGRATED CIRCUIT AND METHOD OF DESIGN THEREOF

(75) Inventor: Masao Mizuno, Hino (JP)

(73) Assignee: Seiko Epson Corporation, Tokyo-to (JP)

( * ) Notice: Subject to any disclaimer, the term of this patent is extended or adjusted under 35 U.S.C. 154(b) by 0 days.

(21) Appl. No.: 09/646,301

(22) PCT Filed: Jan. 19, 2000

(86) PCT No.: PCT/JP00/00216

§ 371 (c)(1),
(2), (4) Date: Oct. 20, 2000

(87) PCT Pub. No.: WO00/44046

PCT Pub. Date: Jul. 27, 2000

(30) Foreign Application Priority Data

Jan. 19, 1999 (JP) .................................... 11-010715

(51) Int. Cl.⁷ ................................................ H05K 7/00
(52) U.S. Cl. .................. 361/820; 361/764; 361/823; 257/698; 257/778; 700/245; 700/254
(58) Field of Search ................................. 361/820, 764, 361/823, 679, 803; 257/698, 778; 700/90, 95, 97, 121, 182, 98, 245, 254; 716/8, 9, 10, 11, 12, 13, 14

(56) References Cited

U.S. PATENT DOCUMENTS 5,265,045 A * 11/1993 Nishio et al. ................. 365/63
5,463,638 A * 10/1995 De Lange ................... 371/22.3
5,877,548 A * 3/1999 Washida et al. ............. 257/690

FOREIGN PATENT DOCUMENTS

JP    4-299843    10/1992
JP    6-77323     3/1994

* cited by examiner

Primary Examiner—David Martin
Assistant Examiner—Hung Bui
(74) Attorney, Agent, or Firm—Oliff & Berridge, PLC (57) ABSTRACT

A semiconductor integrated circuit comprising a functional block 500 which includes macrocells 510 to 513. A macrocell 510 is connected to four input-output terminals 530 to 533 on four sides of an outline of the functional block 500 via a multi-layer wiring 580. Another functional block to be connected to this macrocell 510 is placed in any position upward, downward, left, or right of the functional block 500, whereas one input terminal located closest to the other functional block is selected as an effective terminal among four input-output terminals 530 to 533. Two of the functional blocks are connected only via this effective terminal. The other input-output terminals remain as dummy terminals. It is possible to reduce detouring routing among functional blocks by providing the semiconductor integrated circuit with the functional block 500 having such a configuration.

16 Claims, 12 Drawing Sheets

INTEGRATED CIRCUIT AND METHOD OF DESIGN THEREOF

TECHNICAL FIELD

The present invention relates to a semiconductor integrated circuit and a method of designing the same.

BACKGROUND OF ART

A functional block used for a system LSI is registered as a design asset or intellectual property (IP) in a library for reuse when a system LSI is newly designed. This type of functional block is called an IP block. The IP block is also called a virtual component (VC) such as an actual component on print-circuit boards.

The functional block includes a hard virtual component (HVC) of which the contents can be handled as a black box. Different from a soft virtual component (SVC) and a firm virtual component (FVC), the hard virtual component (HVC) is provided as polygon data, which has the disadvantages of design inflexibility and difficult process transplantation, but the advantage of capability of precisely estimating performance and physical dimensions.

Because of the limitations to performance such as integrity, speed, and power consumption of the functional block itself, input-output terminals of the functional block which can be handled as a black box are provided with routing as described below.

Figure 10:
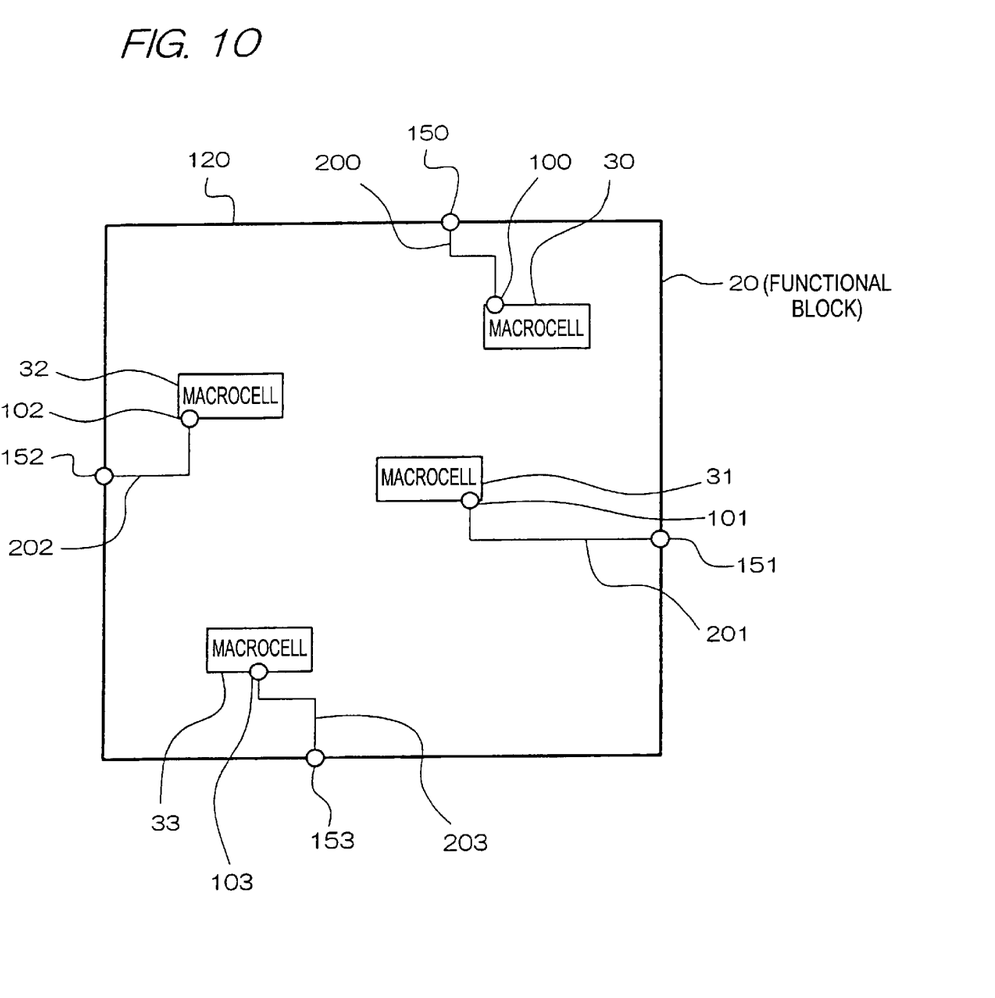
FIG. 10 is a diagram showing a conventional functional block.

FIG. 10 shows an internal layout of a conventional functional block.

A functional block 20 has macrocells 30 to 33, input-output terminals 150 to 153, and multi-layer wirings 200 to 203 inside the functional block.

The macrocell 30 is connected to the input-output terminal 150 via the multi-layer wiring 200. In the same way, the macrocell 31 is connected to the input-output terminal 151 via the multi-layer wiring 201, the macrocell 32 is connected to the input-output terminal 152 via the multi-layer wiring 202, and the macrocell 33 is connected to the input-output terminal 153 via the multi-layer wiring 203.

In FIG. 10, the macrocell 30 is connected to the input-output terminal 150 on an outline 120 nearest the macrocell 30 via the multi-layer wiring 200. In the same way, the macrocells 31 to 33 are connected to the input-output terminals 151 to 153 on the outline 120 nearest these cells.

When routing functional blocks each having a layout as shown in FIG. 10, the routing may significantly detour, resulting in an extended length of routing which impairs the signal delay characteristics.

Figure 11:
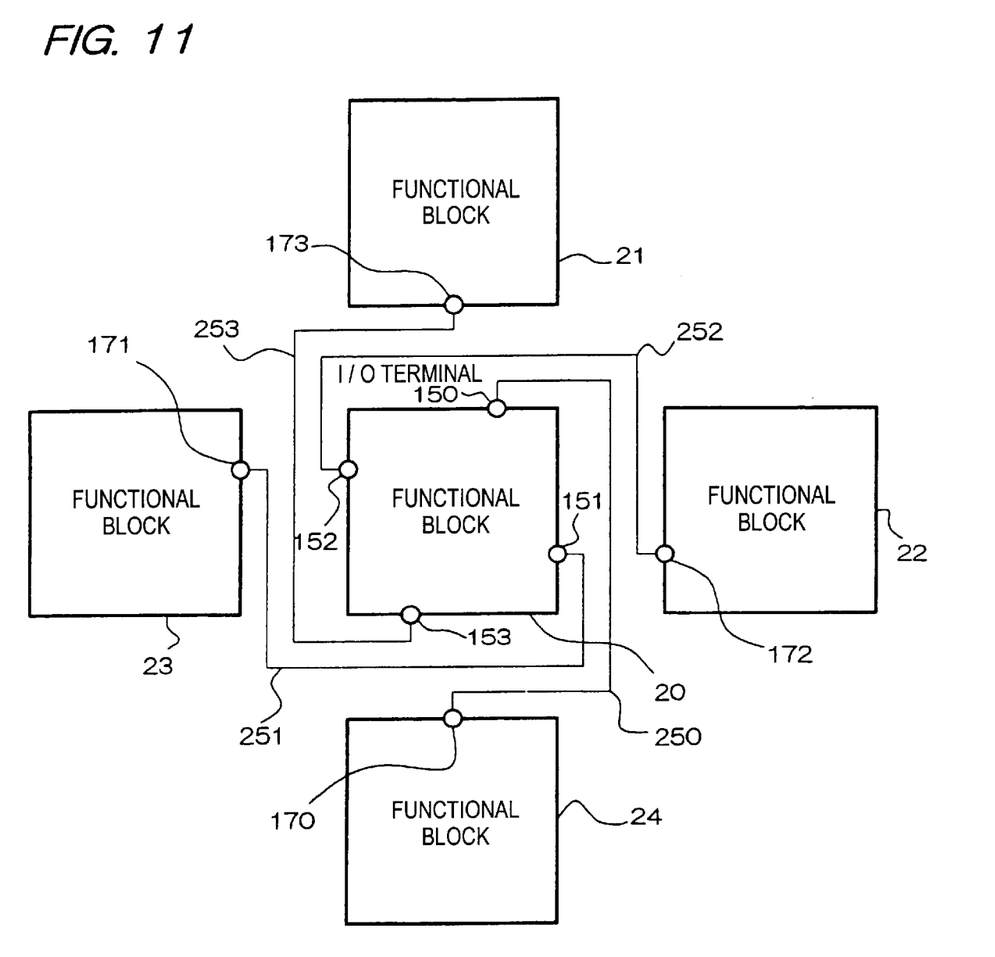
FIG. 11 is a diagram showing the connection of conventional functional blocks shown in FIG. 10.

FIG. 11 shows an example of an extreme routing detour. The semiconductor integrated circuit of FIG. 11 has functional blocks 20 to 24 closely placed each other, with the functional block 20 being connected with each of the functional blocks 21 to 24. The input-output terminal 150 of the functional block 20 is connected to the input-output terminal 170 of the functional block 24 by a multi-layer wiring 250. In the same way, the input-output terminal 151 of the functional block 20 is connected to the input-output terminal 171 of the functional block 23 by the multi-layer wiring 251, the input-output terminal 152 is connected to an input-output terminal 172 of the functional block 22 by a multi-layer wiring 252, and the input-output terminal 153 is connected to an input-output terminal 173 of the functional block 21 by a multi-layer wiring 253.

In this manner, routing among functional blocks may become complicated according to the relative positions of the functional blocks. Because semiconductor integrated circuits commonly used have several hundreds or more functional blocks, the routing connections among the functional blocks may become very complicated.

Figure 12:
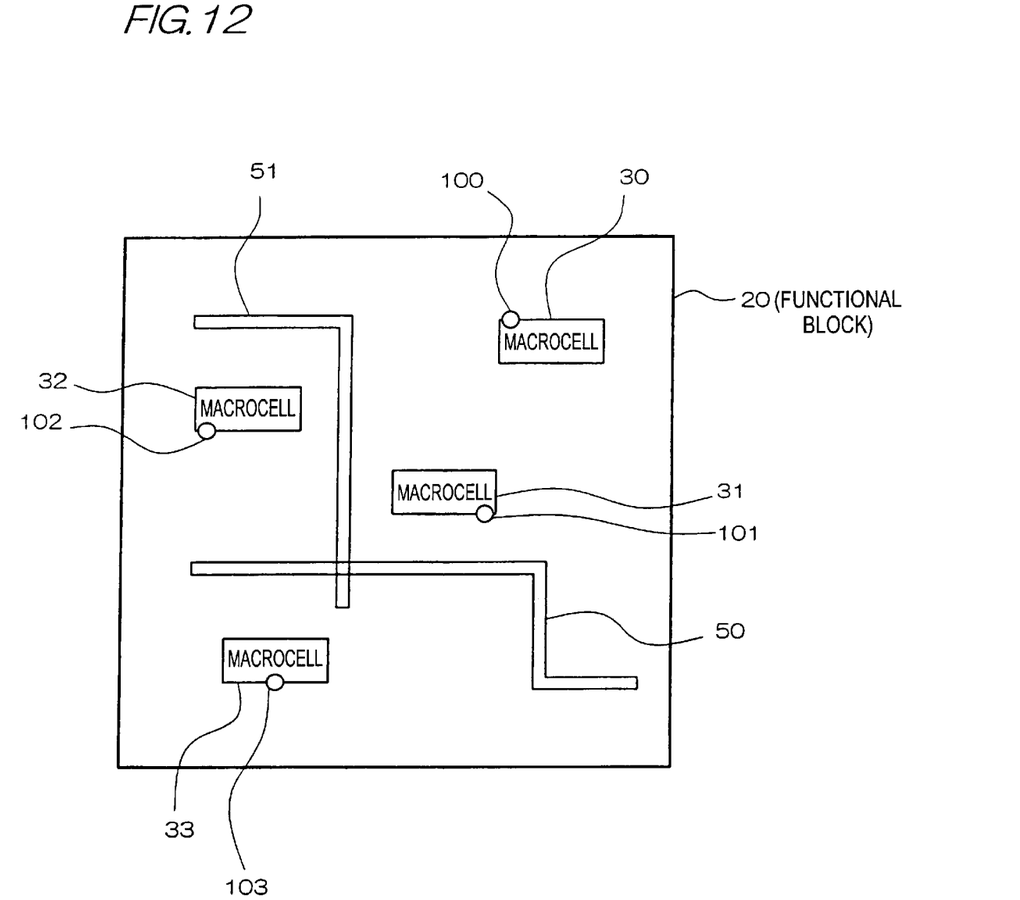
FIG. 12 is a diagram showing a conventional functional block which differs from that shown in FIG. 10.

In addition, as shown in FIG. 12, some semiconductor integrated circuits use signal input-output ports 100 to 103 of macrocells 30 to 33 inside a functional block 20 as the input-output terminal for the functional block 20.

The routing of macrocells inside the functional block 20 having a configuration as shown in FIG. 12 is sometimes hindered by obstacles 50 and 51 which are formed in the functional block 20 due to congestion of the routing inside the semiconductor integrated circuit. The obstacles 50 and 51 are formed when wiring layers are subjected to some restrictions such as lack of routing resources.

An objective of the present invention is to provide a semiconductor integrated circuit having a functional block in which the degree of freedom in the placement and routing can be increased and which, therefore, can be reused as a design asset, and further to provide a method of designing such a semiconductor integrated circuit.

DISCLOSURE OF THE INVENTION

A semiconductor integrated circuit in one aspect of the present invention comprises:
   functional blocks each of which includes an outline having at least four sides; and
   a wiring layer connecting the functional blocks,
   wherein at least one of the functional blocks has at least four terminals, each one of which are placed on each one of at least four sides of the outline, and
   wherein all of the at least four terminals are connected to one point in the at least one of the functional blocks, at least one of the at least four terminals is an effective terminal connected to at least another one of the functional blocks, and a rest of the at least four terminals is a dummy terminal which is not connected to any other of the functional blocks.

This configuration makes it possible to select one terminal which is positioned at the most advantageous point for routing among the terminals placed on each of at least four sides of the functional block as an effective terminal when functional blocks are routed. Use of this effective terminal for connecting functional blocks can prevent a significant detouring of the routing, reduce the length of routing, and solve the signal delay problem. Terminals other than the effective terminal are dummy terminals. Because routing inside the functional block is fixed by this configuration, the electrical characteristics and signal delay characteristics become fixed and stable. Therefore, once a delay simulation inside the functional block has been performed, it is unnecessary to perform the delay simulation again when the functional block is reused thereafter. The functional block in this aspect of the present invention has increased freedom of placement and routing because the designer does not need to look for a placement in which the routing has an advantage by inverting the placement and routing in various directions.

At least two terminals among the at least four terminals of the at least one of the functional blocks may be effective terminals each of which is connected to different one of the other of the functional blocks.

The routing length may be decreased by this placement as compared with the case where routing is provided from one terminal to two functional blocks.

The at least one of the functional blocks may have the effective terminals on at least one side of the outline.

In this instance, each of the effective terminals may be connected to different one of the other of the functional blocks.

The routing length may be decreased by this placement as compared with the case where each of the two effective terminals on different sides is connected to each of the two functional blocks.

Two of the functional blocks may be located adjacent each other, and the effective terminals respectively placed on two facing sides of each of the outlines of the two of the functional blocks may be connected.

The length of the routing among the functional blocks can be minimized in this way.

Macrocells may be placed in the at least one of the functional blocks, and the at least four terminals may be connected in common to one of the macrocells.

Another aspect of the present invention provides a method of designing a semiconductor integrated circuit including: functional blocks each of which includes an outline having at least four sides; and a wiring layer connecting various part within each of the functional blocks and connecting the functional blocks, by an automatic placement-routing device, the method comprising:

a first step of registering a definition of placing terminals on the outline of at least one of the functional blocks for connecting to other of the functional blocks in the automatic placement-routing device;

a second step of registering a net list containing a definition of connections among the functional blocks in the automatic placement-routing device; and a third step of deciding a placement of the functional blocks and a routing among the functional blocks by the automatic placement-routing device according to the definitions which are registered in the first and second steps, wherein the first step comprises a step of defining at least four terminals respectively placed on at least four sides of an outline of the at least one of the functional blocks, and wherein the third step comprises:

a step of selecting at least one of the at least four terminals as an effective terminal for connecting to at least one of other of the functional blocks based on the decided placement of the functional blocks; and a step of selecting a rest of the at least four terminals as a dummy terminal which is not connected to any other of the functional blocks.

This method ensures selection of a terminal which is most advantageous among at least four terminals existing on at least four sides as an effective terminal. Because the other terminals exist as dummy terminals, routing inside the functional block is always fixed, whereby electrical characteristics and signal delay characteristic of the functional block are fixed.

Various embodiments of the semiconductor integrated circuit of the previous aspect of the present invention can be implemented using this design method.

Further aspect of the present invention provides a method of designing a semiconductor integrated circuit including: functional blocks each of which includes an outline having at least four sides; and a wiring layer connecting various part within each of the functional blocks and connecting the functional blocks, by an automatic placement-routing device, the method comprising:

a first step of registering a definition of placing terminals on the outline of at least one of the functional blocks for connecting to other of the functional blocks in the automatic placement-routing device;

a second step of registering a net list containing a definition of connections among the functional blocks in the automatic placement-routing device; and a third step of deciding a placement of the functional blocks, selecting an actual terminal from the definition of the terminals, and deciding a routing within each of and among the functional blocks, by the automatic placement-routing device according to the definitions which are registered in the first and second steps, wherein the first step comprises:

a step of defining at least four terminals respectively placed on at least four sides of an outline of the at least one of the functional blocks; and a step of defining that at least one actual terminal selected from the definition of the at least four terminals is connected to a predetermined point within the at least one of the functional blocks, and wherein the third step comprises:

a step of selecting the at least one actual terminal from the definition of the at least four terminals based on the decided placement of the functional blocks;

a step of connecting only the selected one actual terminal to the predetermined point within the at least one of the functional blocks; and a step of connecting the selected one actual terminal to at least one of other of the functional blocks.

Differing from the above-described method, according to this method only a terminal which is advantageous for connecting one functional block with other functional blocks is present in that functional block and no dummy terminals are required to be present. This can eliminate unnecessary terminals and routing in functional blocks. The degree of freedom of placement and routing of the functional blocks is further increased by this configuration.

BEST MODE FOR CARRYING OUT THE INVENTION

Embodiments of the present invention will be discussed with reference to the drawings.

First Embodiment
(Constitution of Semiconductor Integrated Circuit)

Figure 1:
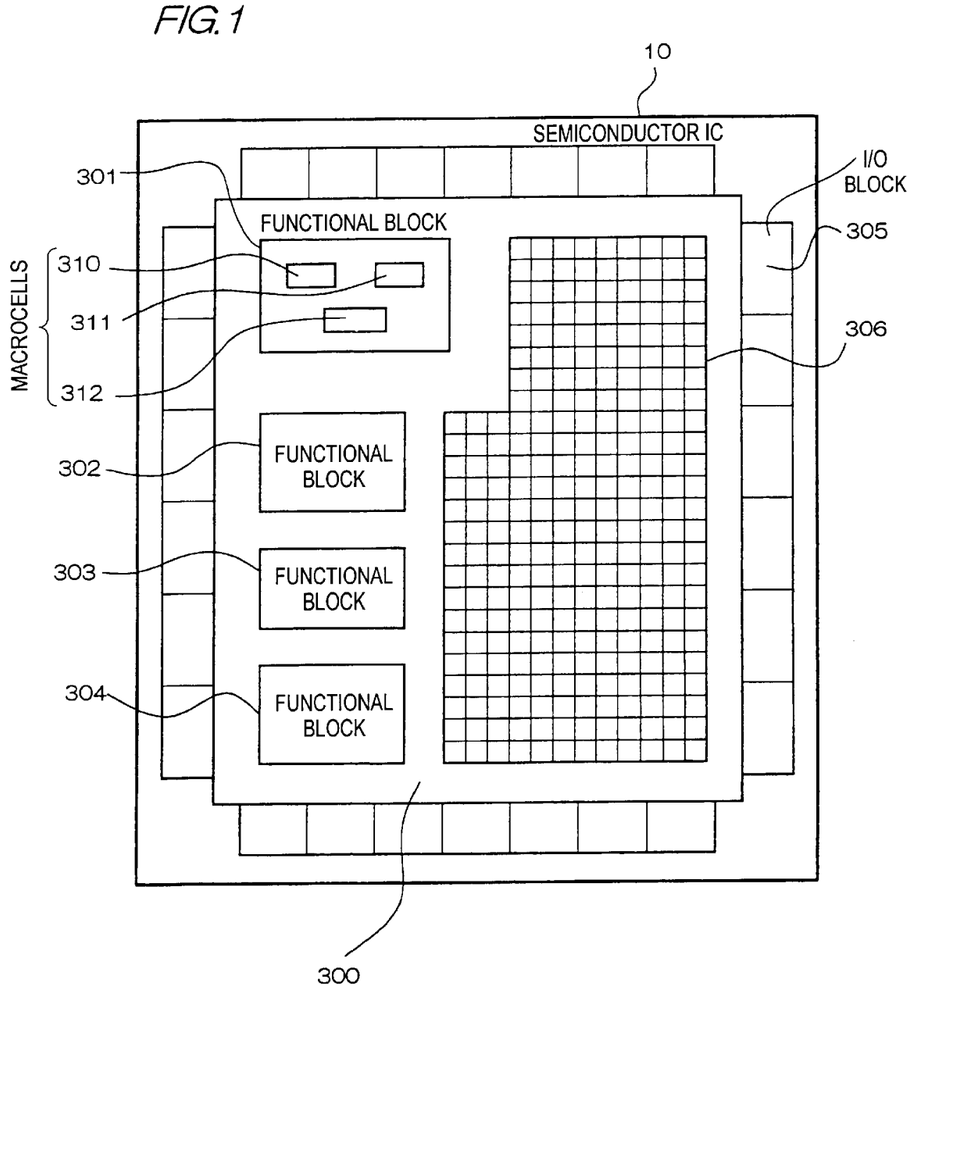
FIG. 1 is a diagram showing an entire view of a semiconductor device according to a first embodiment of the present invention.

FIG. 1 shows an example of a layout of a semiconductor integrated circuit (semiconductor IC) 10 according to the present embodiment.

The semiconductor IC 10 has functional blocks 301 to 304, an input-output block group 305, and basic cell group 306, for example, on a substrate 300.

The basic cell group 306 has a lot of basic cells formed from at least one pair of an N-channel MOS transistor and a P-channel MOS transistor. Macrocells (for example, ALU, multiplexers, etc.) are formed by providing these basic cells with required routing. By providing part of the area in a semiconductor integrated circuit (semiconductor IC) for the basic cells 306 in this manner, the design can be modified by only altering the wiring layers. Thus, it is possible to reduce the number of days for manufacturing semiconductor Ics.

The functional blocks 301 to 304 are units for forming CPUs, memories, and the like. The functional blocks 301 to 304 of this embodiment are hard virtual components (HVC), of which the contents can be handled as a complete black box. Macrocells are also placed inside these functional blocks 301 to 304. For example, the functional block 301 has macrocells 310 to 312 as shown in FIG. 1.

The input-output block group 305 is placed surrounding the circumference of the semiconductor IC 10 and functions to input and output signals to and from a logical circuit region formed inside the semiconductor IC 10.

The semiconductor IC of this embodiment is not necessarily limited to that shown in FIG. 1. It may be the type fabricated using only gate arrays, a standard cell of which the wafer itself is manufactured conforming to a design specification, or a full custom semiconductor IC.

For simplicity, only a limited number of functional blocks (301 to 304) and macrocells (310 to 312) are shown in FIG. 1. However, usually a single integrated circuit has several hundred thousand to several ten million transistors on a substrate, and a number of functional blocks, macrocells, basic cells, etc. corresponding to the number of transistors or greater according to specific requirements.

(Layout Inside Functional Block)

Figure 2:
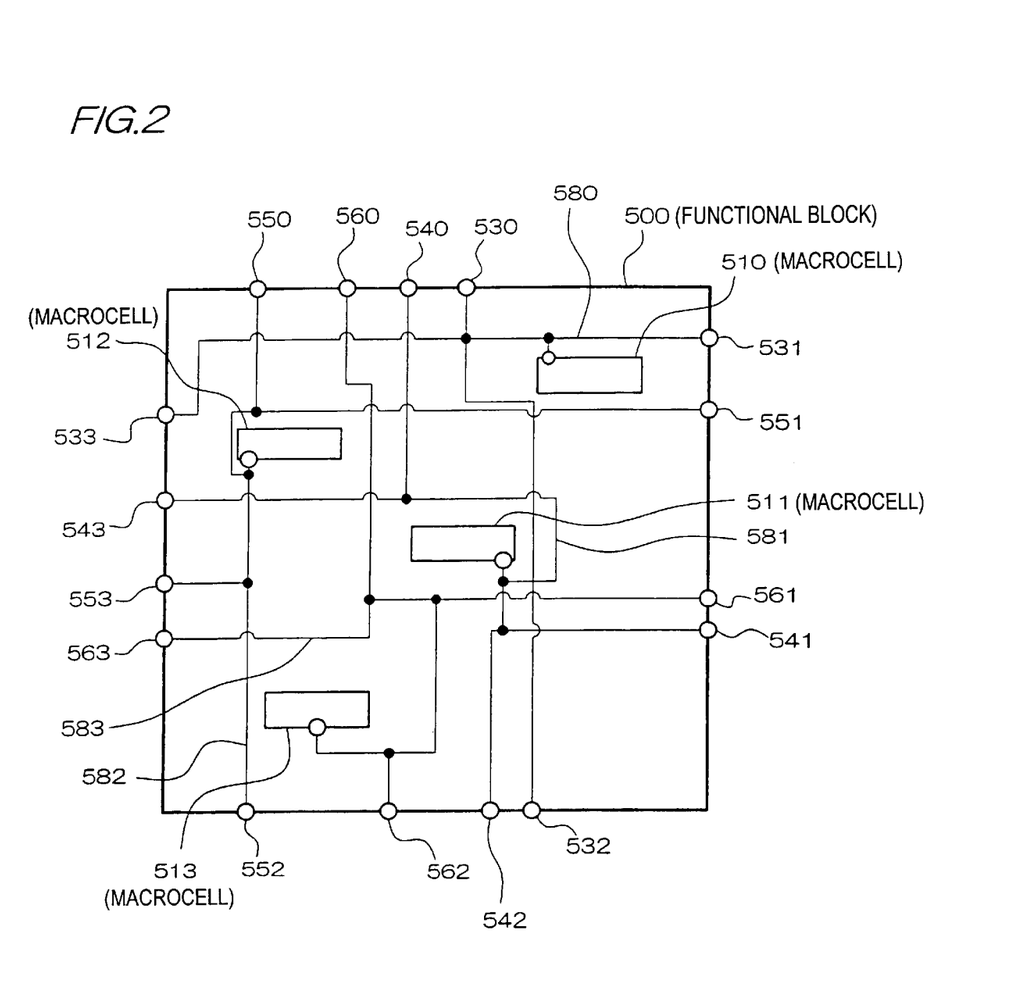
FIG. 2 is a diagram showing one functional block in FIG. 1.

FIG. 2 is a diagram showing a layout of a functional block 500 which is one of the functional blocks 301 to 304 shown in FIG. 1.

The functional block 500 shown in FIG. 2 has macrocells 510 to 513, input-output terminals 530 to 533, 540 to 543, 550 to 553, and 560 to 563, and multi-layer wirings 580 to 583. In the present specification, the term "input-output terminal" collectively indicates input terminals, output terminals, and input-output terminals.

The macrocell 510 is connected to the input-output terminals 530 to 533 via the multi-layer wiring 580. Each of the input-output terminals 530 to 533 is placed on each of the four sides of the outline of the functional block 500. In the same way, the macrocell 511 is connected to the input-output terminals 540 to 543 via the multi-layer wiring 581, the macrocell 512 is connected to the input-output terminals 550 to 553 via the multi-layer wiring 582, and the macrocell 513 is connected to the input-output terminals 560 to 563 via the multi-layer wiring 583.

Taking the case in which signals are output from the macrocell 510 as an example, the input-output terminals 530 to 533 connected to the macrocell 510 through the multi-layer wiring 580 have the same potential. Accordingly, the four input-output terminals 530 to 533 connected to the one macrocell 510 can be the to be the same potential pin.

(Routing Inside Functional Block)

Figure 3:
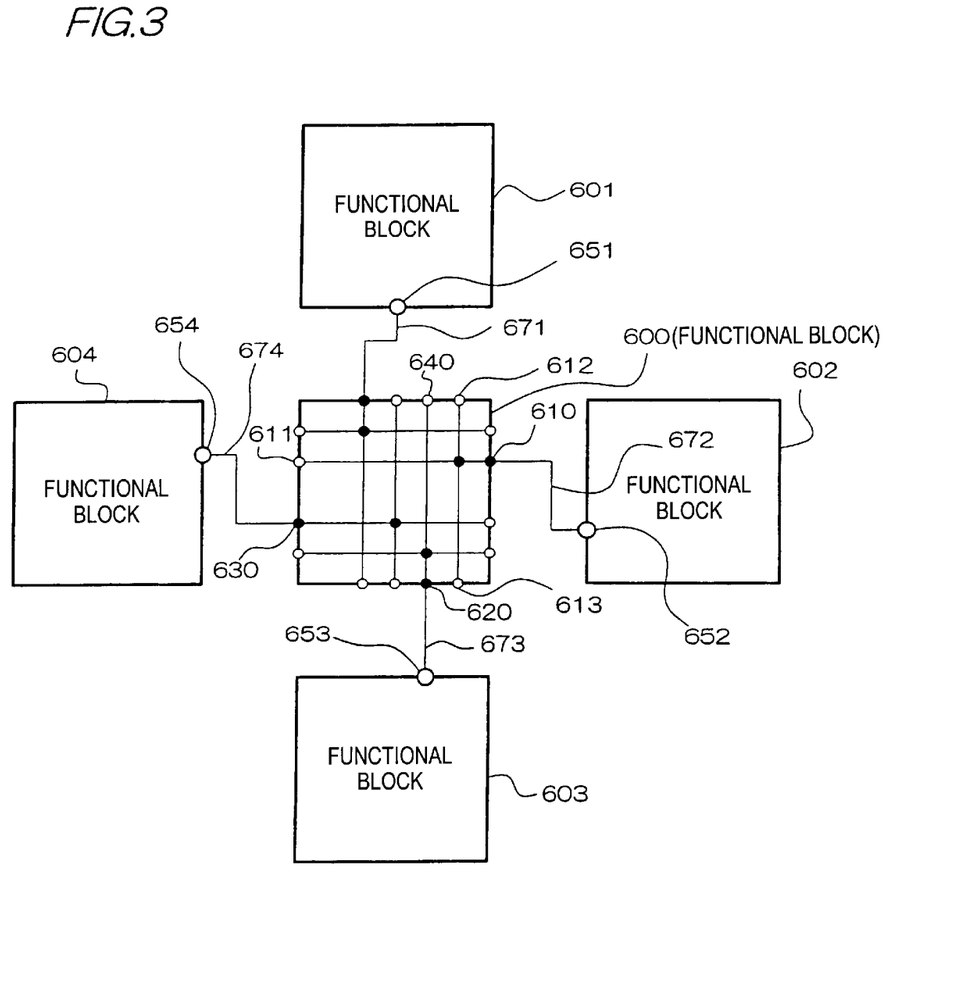
FIG. 3 is a diagram showing the routing of functional blocks each having a configuration shown in FIG. 2.

FIG. 3 shows the state in which functional blocks 600 to 603 each having a configuration as shown in FIG. 2 are routed.

In a functional block 600, one input-output terminal 610 among input-output terminals 610 to 613 having the same potential is selected and connected with an input-output terminal 652 of the functional block 602 through a multi-layer wiring 672. Therefore, only the input-output terminal 610 among the input-output terminals 610 to 613 becomes effective, while the other three input-output terminals 611 to 613 are dummy terminals which are not connected to any other functional blocks 601 to 604. In this manner, in connecting the functional blocks 600 and 602, the input-output terminal 610 which is closest to the functional block 602 among the input-output terminals 610 to 613 respectively placed on the four sides of the outline of the functional block 600 is selected as an effective terminal. In other words, the two functional blocks 600 and 602 closely located are connected via the terminals 610 and 652 on the two facing sides among the four sides of each of the outlines of the functional blocks 600 and 602.

The length of the wiring 672 between the functional blocks 600 and 602 can be minimized and the shape can be simplified in this manner.

In the same manner, the functional block 600 is connected with the functional blocks 601, 603, and 604 respectively via multi-layer wirings 671, 673, and 674 having a minimum length and simplest shape.

In this way, a routing with the shortest length and simplest shape can be designed without a routing detour shown in FIG. 11 by providing one input-output terminal which functions as the same potential pin on each side of the outline routing of the functional block 500 shown in FIG. 3.

Generally, the number of input-output terminals in a functional block used for a system LSI is several hundred or more. Therefore, providing the functional block with input-output terminals having the same potential can increase generalization of placement and routing of the functional block itself. In addition, the design freedom for the placement and routing in the system LSI also increases. In this embodiment, each one of input-output terminals showing the same potential is provided on each of four sides of the outline. This is different from a conventional functional block in which one input-output terminal is provided only on one side of the outline of a functional block. This configuration of the present invention increases freedom of the placement and routing among functional blocks and between functional blocks and outside macrocells, thereby ensuring a simple routing process in the placement and routing step.

In addition, because the electrical characteristics and delay characteristics are fixed by fixing the routing inside the functional blocks, a delay simulation process for inside the functional blocks can be omitted every time when a new semiconductor IC is designed.

Figure 4:
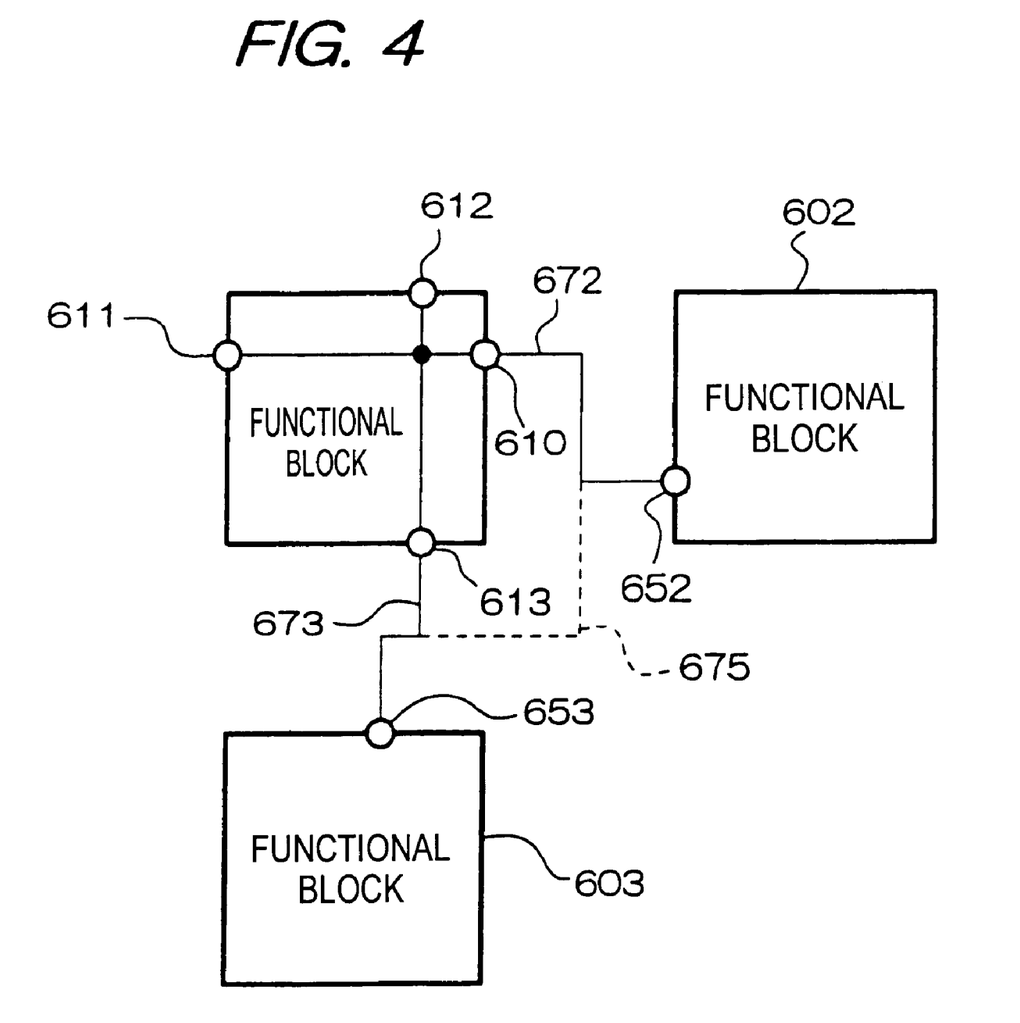
FIG. 4 is a diagram showing a connection between common terminals for a functional block having a configuration shown in FIG. 2 and two other functional blocks.

FIG. 4 shows that two input-output terminals 610 and 613 are selected from the input-output terminals 610 to 613 each having the same potential in the functional block 600 and connected respectively with the input-output terminals 652 and 653 of two functional blocks 602 and 603 through multi-layer wirings 672 and 673.

If the functional blocks 600 and 603 are routed using the multi-layer wiring 675 branching from the multi-layer wiring 672 shown by a broken line in FIG. 4, the routing length increases and the routing shape becomes complicated. Therefore, the use of the multi-layer wiring 673 which is shorter and more simple in shape than the multi-layer wiring 675 is desirable.

Figure 5:
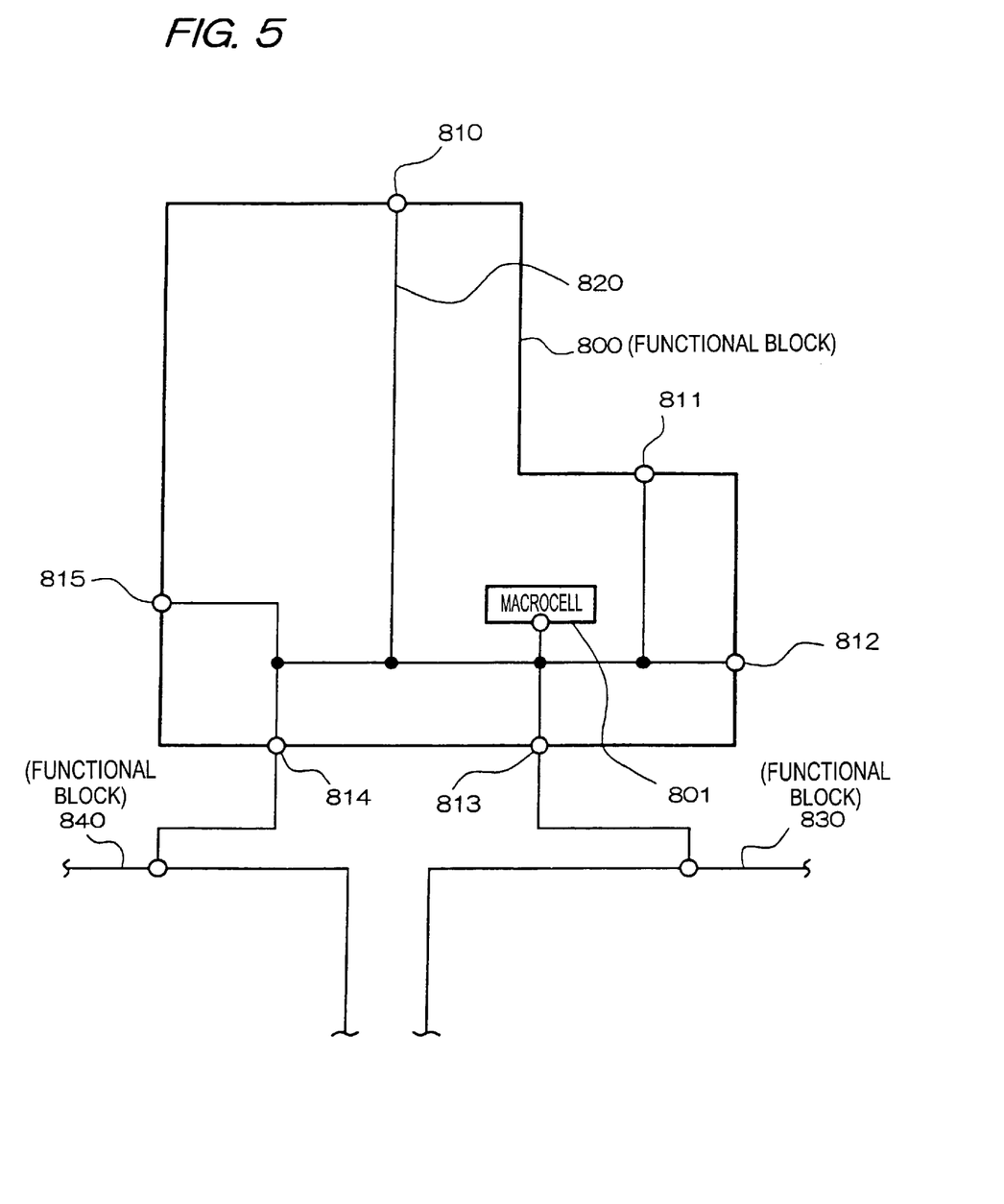
FIG. 5 is a diagram showing a functional block having a contour configuration which differs from that shown in FIG. 2.

The number of sides of the outline of a functional block is not limited to four, but may be five or more as shown in FIG. 5.

The functional block shown in FIG. 5 has an outline formed of six sides. In this embodiment, a macrocell 800 inside this functional block has input-output terminals 810 to 815 connected by a multi-layer wiring 820. The degree of freedom of placement and routing further increases by increasing the number of input-output terminals corresponding to the shape of the outline in this manner.

The functional block shown in FIG. 5 has two input-output terminals 813 and 814, for example, on one side of the outline. This makes it possible to connect the two input-output terminals 813 and 814 located on one side as shown in FIG. 5 with two different functional blocks 830 and 840. The degree of freedom of placement and routing of the functional blocks is further increased by this configuration. It is needless to mention that one input-output terminal which is selected from the two input-output terminals 813 and 814 for making the routing length shortest and the routing shape simplest can be connected to another functional block.

Because the degree of freedom of placement and routing in the functional blocks having input-output terminals on each side of the outline increases, such configurations can be utilized as effective intellectual properties (IP) in designing LSIs.

Second Embodiment

In this second embodiment, a procedure for placement and routing of functional blocks and macrocells in a master slice-type semiconductor IC having a configuration described in the first embodiment using an automatic placement-routing device will be described referring to the flowchart shown in FIG. 6.

First, a definition related to the position and the like of input-output terminals of every functional block is registered in a library, and then the library is input to the automatic placement-routing device (Step 1). Next, a net list in which the connections among functional blocks are defined is input to the automatic placement-routing device (Step 2). Then, the placement and routing for the functional blocks are decided (Step 3).

An example of registration of the definition for the positions of the input-output terminals performed in the Step 1 of FIG. 6 will now be described referring to FIGS. 7A and 7B. FIGS. 7A and 7B are models showing necessary definitions for automatic placement-routing of functional blocks 900 and 901. In FIGS. 7A and 7B, the functional blocks 900 and 901 are provided with grids and input-output terminals are defined at the intersecting point of the grids.

As shown in FIG. 7A, the functional block 900, for example, has a logical circuit region 910 and a peripheral region 911 in which the input-output terminals located in the circumference of the peripheral region 911 are defined. In the same way, the functional block 901 also has a logical circuit region 920 and a peripheral region 921.

An input-output terminal F4 for macrocells is provided at the coordinate (F, 4) inside this functional block 900. The positions for input-output terminals which are connected in common with the input-output terminal F4 of macrocells are defined in Step 1 of FIG. 6. These input-output terminals are input-output terminals E1, H3, A4, and F8 which are located at coordinates (E,1), (H,3), (A,4), and (F,8). In addition, the connections of all input-output terminals E1, H3, A4, and F8 are defined.

In the same way, the positions and mutual connections for input-output terminals M11, I17, P17, M18 which are connected in common with an input-output terminal M16 of macrocells in the functional block 901 shown in FIG. 7B are also defined.

Figure 6:
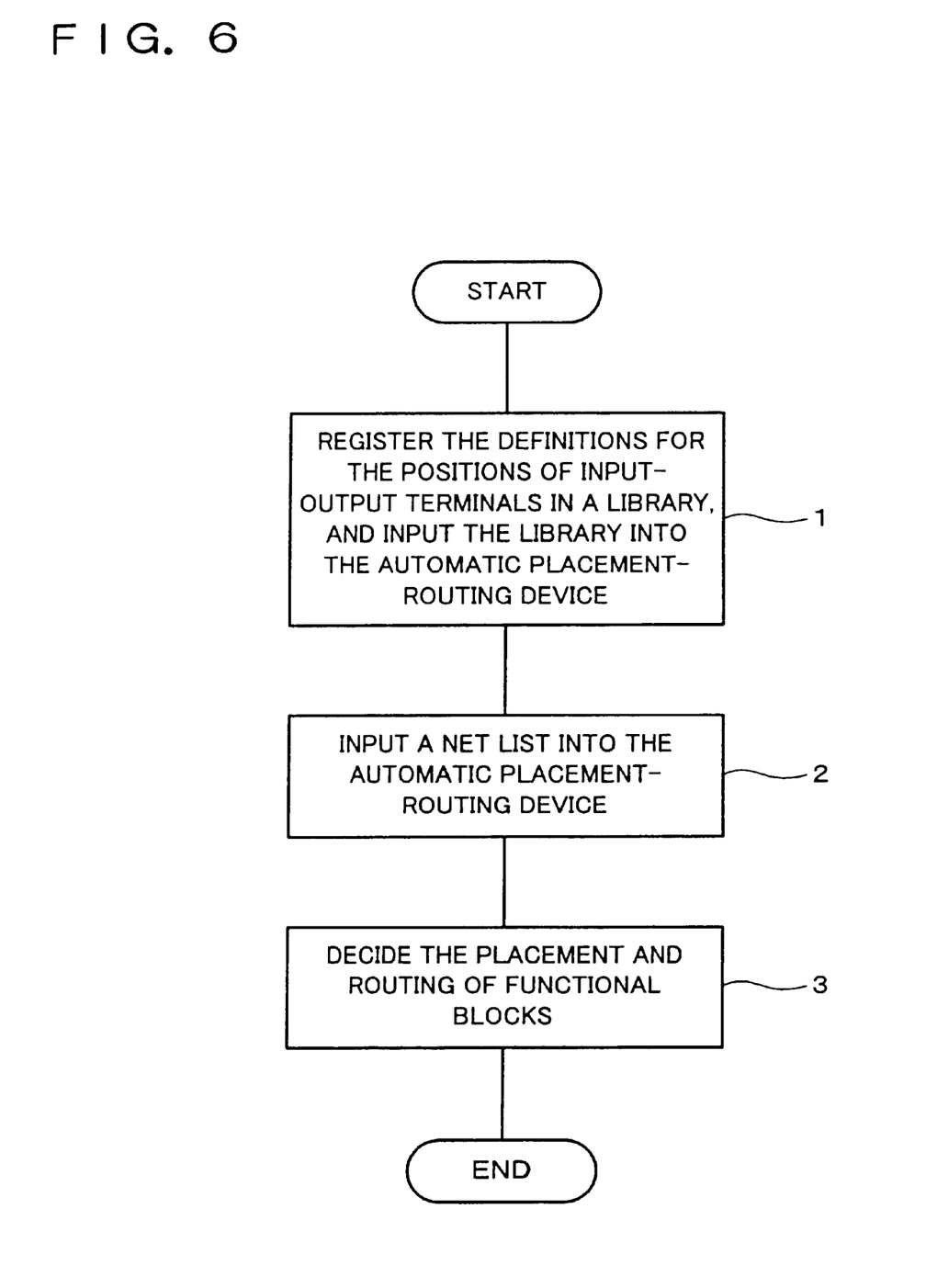
FIG. 6 is a flowchart showing a brief process for automatic placement-routing used in second and third embodiments of the present invention.
Figure 7A:
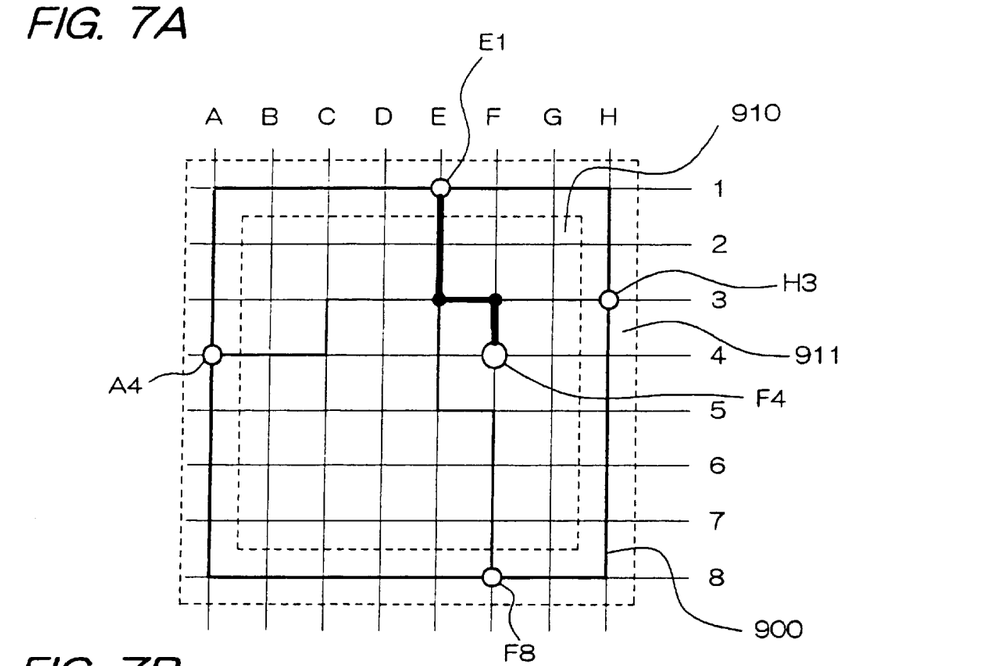
FIGS. 7A and 7B are views for describing the definition of the input-output terminal positions in the second and third embodiments.
Figure 7B:
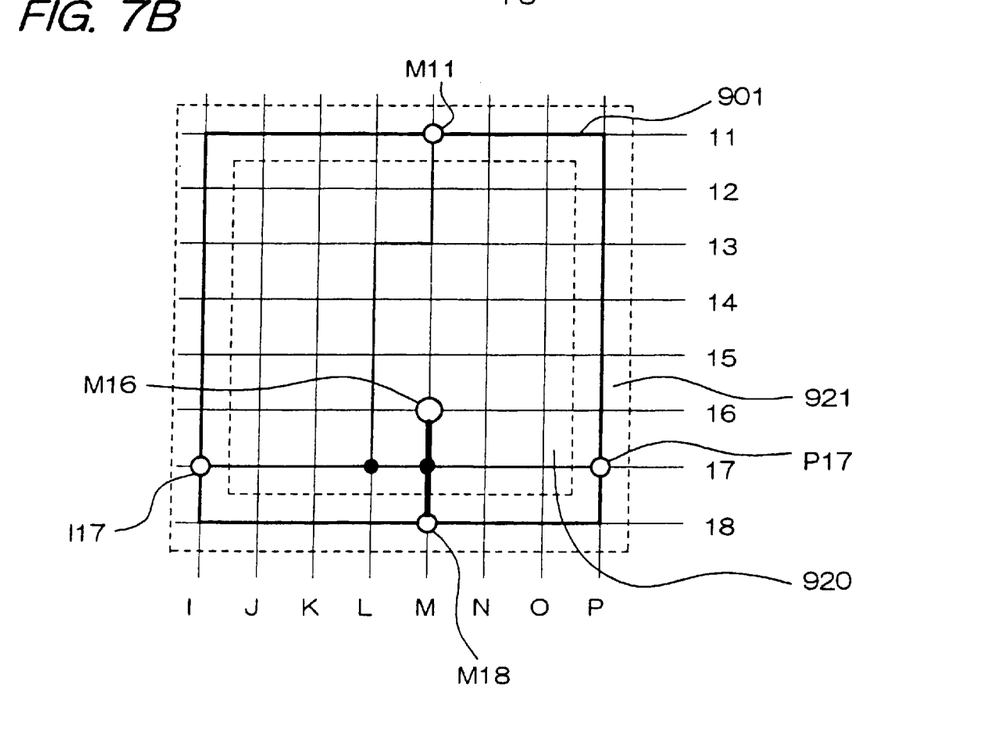

Next, in Step 2 of FIG. 6 the relationship of connections among the functional blocks is defined by the net list. As an example, mutual connection of the input-output terminal F4 of macrocells in the functional block 900 and the input-output terminal M16 for macrocells in the functional block 901 is defined.

Then, the placement and routing among the functional blocks are decided by the automatic placement-routing device based on the above-mentioned definitions in Step 3 of FIG. 6.

Figure 8A:
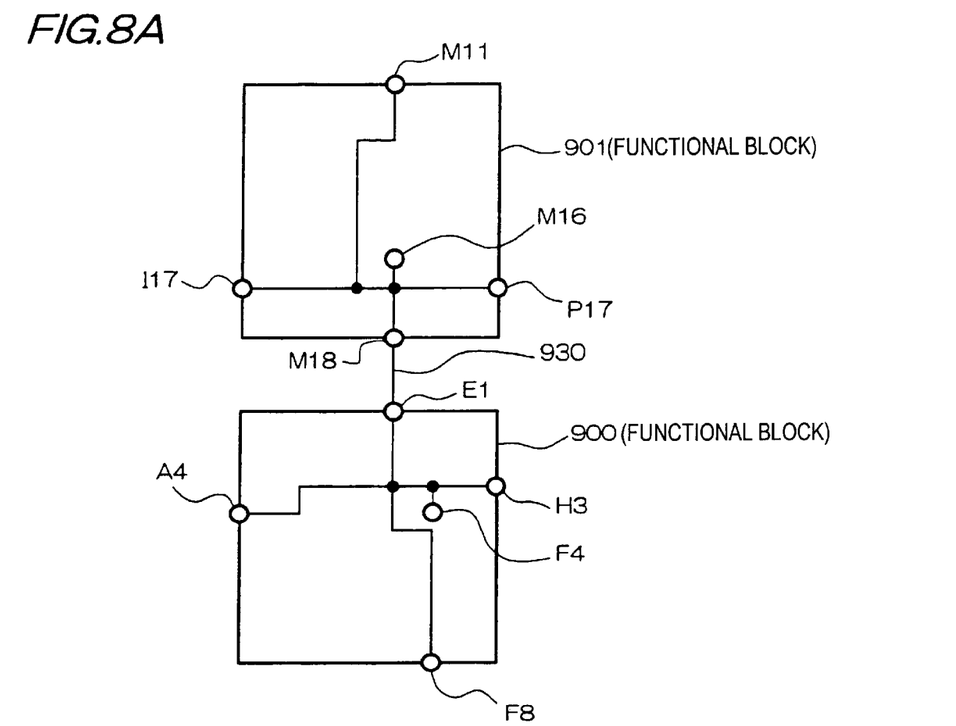
FIGS. 8A and 8B are diagrams showing the states in which functional blocks having different relative positional relationships are connected in the second embodiment.
Figure 8B:
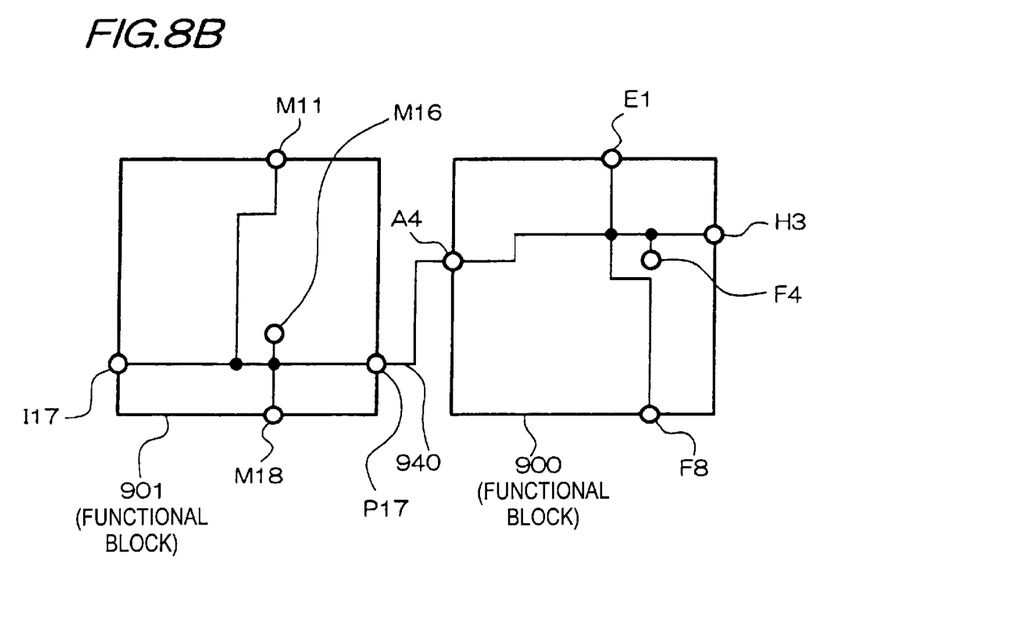

FIGS. 8A and 8B show other examples of the placement and routing of the functional blocks obtained by the automatic placement-routing device.

In FIG. 8A, the functional block 901 is placed above the functional block 900. Therefore, to route the two functional blocks 900 and 901 by the shortest routing, the input-output terminal E1 of the functional block 900 and the input-output terminal M18 of the functional block 901 are selected as effective terminals, and these terminals are connected by wiring 930. All six input-output terminals other than the input-output terminals E1 and M18 are dummy terminals.

In FIG. 8B, the functional block 900 is placed on the left side of the functional block 901. Therefore, to route the two functional blocks 900 and 901 by the shortest routing, the input-output terminal A4 of the functional block 900 and the input-output terminal P17 of the functional block 901 are selected as effective terminals, and these terminals are connected by wiring 930. All six input-output terminals other than the input-output terminals A4 and P17 are dummy terminals.

The input-output terminal for macrocells and the input-output terminals on the four sides are connected via a multi-layer wiring inside the functional block 900 and 901 in both FIGS. 8A and 8B.

In this manner, the effective terminals are decided from input-output terminals provided on each side of the outline of a functional block according to the relative positions of surrounding functional blocks. A simple routing can be implemented without detouring the routing among functional blocks by performing the above-described steps.

Third Embodiment

Figure 9A:
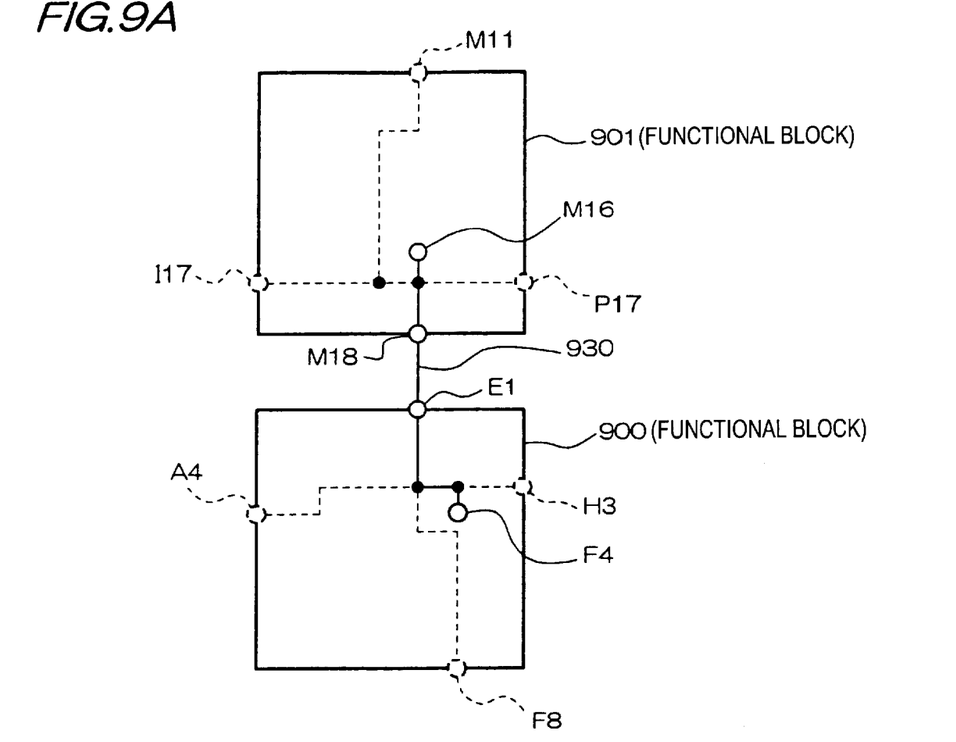
FIGS. 9A and 9B are diagrams showing the states in which functional blocks having different relative positional relationships are connected in the third embodiment.
Figure 9B:
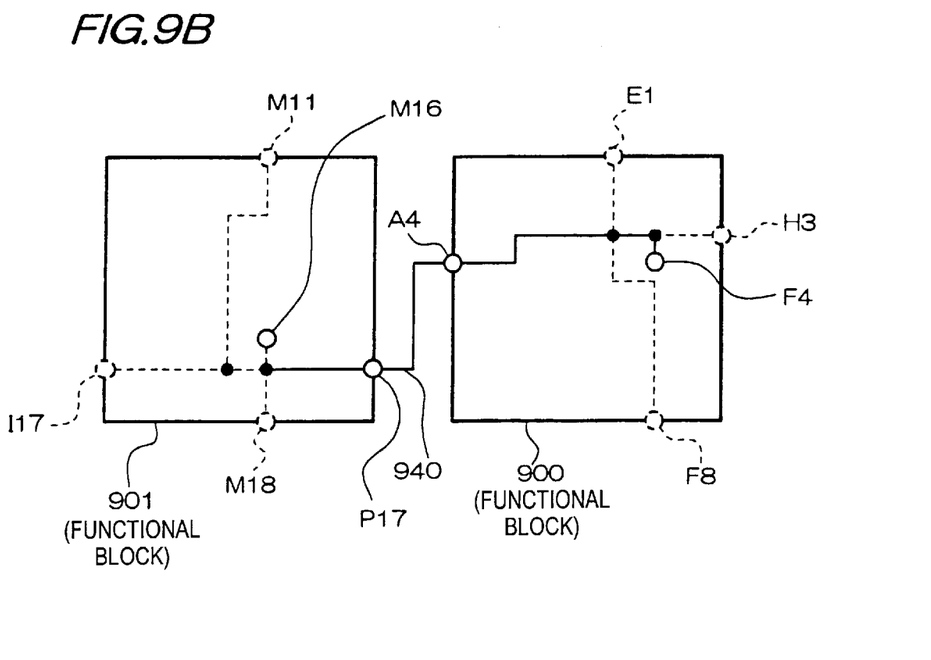

A third embodiment is related to a method of performing the placement and routing shown in FIG. 9A or FIG. 9B. In FIGS. 9A and 9B, the shortest routing is decided by actually locating only one input-output terminal (effective terminal) on one side of the outline of each of the mutually connected functional blocks 900 and 901, without locating input-output terminals (dummy terminals) on the other three sides.

Steps differing from the steps 1 and 3 in the second embodiment shown in FIG. 6 are employed for performing such a design method.

First, in Step 1 of FIG. 6, the procedures of inputting the definition for the positions of input-output terminals E1, A4, F8, and H3 of the functional block 900 shown in FIG. 7A and the definition for the positions of input-output terminals M11, I17, M18, and P17 of the functional block 901 shown in FIG. 7B in the automatic placement-routing device are the same as those in the second embodiment. However, in the second embodiment the input-output terminal F4 for macrocells shown in FIG. 7A is defined as being connected to at least one of the four input-output terminals E1, A4, F8, and H3. The definitions of connections of the input-output terminal M16 for macrocells and the input-output terminals M11, I17, M18, P17 on the outline shown FIG. 7B are also the same.

Next, in Step 3 of FIG. 6, one actual terminal is selected for each of the functional blocks 900 and 901 based on the placement of the decided functional blocks 900 and 901 from the definitions of the positions for the four input-output terminals. A routing is decided so that the functional blocks 900 and 901 are connected through the selected terminals.

In the case of FIG. 9A, the input-output terminals E1 and M18 are selected as actual terminals for connecting the functional blocks 900 and 901. The routing is decided so that these actual terminals are connected by the wiring 930. In the case of FIG. 9B, the input-output terminals A4 and P17 are selected as actual terminals for connecting the functional blocks 900 and 901. The routing is decided so that these actual terminals are connected by the wiring 930.

FIGS. 9A and 9B differ from FIGS. 8A and 8B as follows. As shown in FIG. 9A, in the functional block 900 the input-output terminal F4 of macrocells is connected only to the input-output terminal E1 of the functional block 900. No other input-output terminals such as A4, F8, and H3 are actually present. Therefore, these terminals will never be routed with the input-output terminal F4 of macro-cells. In the same way, in the functional block 901 shown in FIG. 9A, the input-output terminal M16 for macrocells is connected only to the input-output terminal M18 of the functional block 901. No other input-output terminals such as M11, I17, and P17 are actually present. Therefore, these terminals will never be connected with the input-output terminal M16 of macro-cells. The same applies to the examples shown in FIG. 9B.

In this manner, according to the third embodiment functional blocks can be connected by the shortest routing without providing unnecessary routing within the functional blocks.

The present invention is not limited to the embodiments described above. Many modifications and variations are possible without departing from the spirit and scope of the present invention. For example, various connections shown in FIGS. 3 to 5 which are explained relating to the first embodiment can be applied to second and third embodiments.

To implement the connection shown in FIG. 4, for example, the net list registered by Step 2 of FIG. 6 defines that macrocells in the functional block 600 in FIG. 4 are connected in common with the other functional block 602 and 603 shown in FIG. 4, and the two terminals 610 and 613 are selected as the effective terminals or the actual terminals among four terminals 610 to 613 shown in FIG. 4. In the design method according to the third embodiment, the terminals 611 and 612 in FIG. 4 do not actually exist, but exist only as a definition.

Next, to implement the connection shown in FIG. 5, two terminals 813 and 814 are defined on one side of the outline of the functional block 800 shown in FIG. 5 by Step 1 of FIG. 6. Then, based on the information in the net list registered in Step 2 of FIG. 6, both the terminals 813 and 814 are selected as the effective terminal or actual terminals. In the design method according to the third embodiment, the terminals 810 to 812 in FIG. 5 do not actually exist, but exist only as a definition.

What is claimed is:

1. A semiconductor integrated circuit comprising:
   functional blocks each of which includes an outline having at least four sides; and
   a wiring layer connecting the functional blocks,
   wherein at least one of the functional blocks has at least four terminals, each one of which are placed on each one of the at least four sides of the outline, and
   wherein all of the at least four terminals are electrically connected in the at least one of the functional blocks, at least one of the at least four terminals is an effective terminal connected to at least another one of the functional blocks, and the remainder of the at least four terminals are dummy terminals which are not connected to any other of the functional blocks.

2. The semiconductor integrated circuit according to claim 1,
   wherein at least two terminals among the at least four terminals of the at least one of the functional blocks are effective terminals, each of which is connected to a different one of the other functional blocks.

3. The semiconductor integrated circuit according to claim 1,
   wherein the at least one of the functional blocks has the effective terminals on at least one side of the outline.

4. The semiconductor integrated circuit according to claim 3,
   wherein each of the effective terminals placed on at least one side of the outline is connected to different one of the other of the functional blocks.

5. The semiconductor integrated circuit according to claim 1,
   wherein two of the functional blocks are located adjacent each other, and the effective terminals respectively placed on two facing sides of each of the outlines of the two of the functional blocks are connected.

6. The semiconductor integrated circuit according to claim 1,
   wherein macrocells are placed in the at least one of the functional blocks, and the at least four terminals are connected in common to one of the macrocells.

7. A method of designing a semiconductor integrated circuit including: functional blocks each of which includes an outline having at least four sides; and a wiring layer connecting various part within each of the functional blocks and connecting the functional blocks, by an automatic placement-routing device, the method comprising:
   a first step of registering a definition of placing terminals on the outline of at least one of the functional blocks for connecting to other of the functional blocks in the automatic placement-routing device;
   a second step of registering a net list containing a definition of connections among the functional blocks in the automatic placement-routing device; and
   a third step of deciding a placement of the functional blocks and a routing among the functional blocks by the automatic placement-routing device according to the definitions which are registered in the first and second steps, wherein the first step comprises a step of defining at least four terminals respectively placed on at least four sides of an outline of the at least one of the functional blocks, and wherein the third step comprises:
- a step of selecting at least one of the at least four terminals as an effective terminal for connecting to at least one of other of the functional blocks based on the decided placement of the functional blocks; and
- a step of selecting a rest of the at least four terminals as a dummy terminal which is not connected to any other of the functional blocks.

8. The method of designing a semiconductor integrated circuit according to claim 7, wherein the third step comprises a step of connecting each of at least two effective terminals, which are selected from the at least four terminals provided in the at least one of the functional blocks, to different one of the other of the different functional blocks.

9. The method of designing a semiconductor integrated circuit according to claim 7, wherein the first step comprises a step of registering the definition of placing terminals at points on one side of the outline of the at least one of the functional blocks.

10. The method of designing a semiconductor integrated circuit according to claim 9, wherein the third step comprises a step of connecting each of the effective terminals which are selected from the terminals placed on the at least one side of the outline, to different one of the other of the functional blocks.

11. The method of designing a semiconductor integrated circuit according to claim 7, wherein the third step comprises a step of connecting terminals placed on two facing sides of each of the outlines of two of the functional blocks which are located adjacent each other.

12. A method of designing a semiconductor integrated circuit including: functional blocks each of which includes an outline having at least four sides; and a wiring layer connecting various part within each of the functional blocks and connecting the functional blocks, by an automatic placement-routing device, the method comprising:
- a first step of registering a definition of placing terminals on the outline of at least one of the functional blocks for connecting to other of the functional blocks in the automatic placement-routing device;
- a second step of registering a net list containing a definition of connections among the functional blocks in the automatic placement-routing device; and
- a third step of deciding a placement of the functional blocks, selecting an actual terminal from the definition of the terminals, and deciding a routing within each of and among the functional blocks, by the automatic placement-routing device according to the definitions which are registered in the first and second steps, wherein the first step comprises:
- a step of defining at least four terminals respectively placed on at least four sides of an outline of the at least one of the functional blocks; and
- a step of defining that at least one actual terminal selected from the definition of the at least four terminals is connected to a predetermined point within the at least one of the functional blocks, and wherein the third step comprises:
- a step of selecting the at least one actual terminal from the definition of the at least four terminals based on the decided placement of the functional blocks;
- a step of connecting only the selected one actual terminal to the predetermined point within the at least one of the functional blocks; and
- a step of connecting the selected one actual terminal to at least one of other of the functional blocks.

13. The method of designing a semiconductor integrated circuit according to claim 12, wherein the third step comprises:
- a step of selecting at least two actual terminals from the definition of the at least four terminals provided in the at least one of the functional blocks; and
- a step of connecting each of the at least two actual terminals to different one of at least two of the other of the functional blocks.

14. The method of designing a semiconductor integrated circuit according to claim 12, wherein the first step comprises a step of registering the definition at points on one side of the outline of the at least one of the functional blocks.

15. The method of designing a semiconductor integrated circuit according to claim 14, wherein the third step comprises a step of connecting each of the at least two actual terminals, which are selected from the terminals placed on the at least one side of the outline, to different one of at least two of the other of the functional blocks.

16. The method of designing a semiconductor integrated circuit according to claim 12, wherein the third step comprises a step of connecting actual terminals placed on two facing sides of each of the outlines of two of the functional blocks which are located adjacent each other.

* * * * *

UNITED STATES PATENT AND TRADEMARK OFFICE
CERTIFICATE OF CORRECTION

PATENT NO.      : 6,414,852 B1
DATED           : July 2, 2002
INVENTOR(S)     : Masao Mizuno It is certified that error appears in the above-identified patent and that said Letters Patent is hereby corrected as shown below:

<u>Title page,</u>
Item [54], the title should read as follows:
-- SEMICONDUCTOR INTEGRATED CIRCUIT AND METHOD OF DESIGNING THE SAME --

Signed and Sealed this

Fourteenth Day of January, 2003

JAMES E. ROGAN
*Director of the United States Patent and Trademark Office*